(12) United States Patent
Shah et al.

(10) Patent No.: US 9,800,208 B2
(45) Date of Patent: Oct. 24, 2017

(54) RADIO FREQUENCY DEVICES WITH SURFACE-MOUNTABLE CAPACITORS FOR DECOUPLING AND METHODS THEREOF

(71) Applicant: Freescale Semiconductor, Inc., Austin, TX (US)

(72) Inventors: Mahesh K. Shah, Scottsdale, AZ (US); Jerry L. White, Glendale, AZ (US); Li Li, Scottsdale, AZ (US); Hussain H. Ladhani, Chandler, AZ (US); Audel A. Sanchez, Tempe, AZ (US); Lakshminarayan Viswanathan, Phoenix, AZ (US); Fernando A. Santos, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/044,701

(22) Filed: Feb. 16, 2016

(65) Prior Publication Data
US 2016/0164471 A1 Jun. 9, 2016

Related U.S. Application Data

(63) Continuation of application No. 14/316,484, filed on Jun. 26, 2014, now Pat. No. 9,300,254.

(51) Int. Cl.
*H03F 1/00* (2006.01)
*H03F 1/02* (2006.01)
(Continued)

(52) U.S. Cl.
CPC ....... *H03F 1/0288* (2013.01); *H01L 23/3107* (2013.01); *H01L 23/49562* (2013.01); *H01L 23/642* (2013.01); *H01L 23/66* (2013.01); *H03F 1/0283* (2013.01); *H03F 1/30* (2013.01); *H03F 1/565* (2013.01); *H03F 3/193* (2013.01); *H03F 3/195* (2013.01); *H03F 3/211* (2013.01); *H03F 3/213* (2013.01); *H03H 1/00* (2013.01); *H05K 7/005* (2013.01); *H01L 2223/665* (2013.01); *H01L 2223/6655* (2013.01); *H01L 2223/6666* (2013.01); *H01L 2224/49175* (2013.01); *H01L 2924/0002* (2013.01); *H03F 2200/267* (2013.01); *H03F 2200/451* (2013.01); *H03F 2200/555* (2013.01); *H03F 2203/21103* (2013.01); *H03F 2203/21106* (2013.01); *H03F 2203/21139* (2013.01); *H03H 7/38* (2013.01); *H03H 2001/0021* (2013.01)

(58) Field of Classification Search
CPC ........................... H03F 3/213; H03F 2200/297
USPC ......................... 330/65, 66, 67, 68
See application file for complete search history.

(56) References Cited

U.S. PATENT DOCUMENTS

| | | | | |
|---|---|---|---|---|
| 6,081,160 A | * | 6/2000 | Custer | H03F 1/483 330/286 |
| 2014/0022020 A1 | * | 1/2014 | Aaen | H01L 23/552 330/295 |

OTHER PUBLICATIONS

Ladhani et al., "Improvements in the instantaneous-Bandwidth Capability of RF Power Transistors using In-Package High-k Capacitors", IEEE Microwave Symposium Digest, 2011.*

* cited by examiner

*Primary Examiner* — Steven J Mottola

(57) ABSTRACT

An embodiment of a radio-frequency (RF) device includes at least one transistor, a package, and a surface-mountable capacitor. The package contains the at least one transistor and includes at least one termination. The surface-mountable capacitor is coupled in a shunt configuration between (Continued)

the at least one transistor and a power supply terminal of the device to decouple the at least one transistor from a power supply.

18 Claims, 7 Drawing Sheets

(51) Int. Cl.
*H03F 3/195* (2006.01)
*H03F 3/213* (2006.01)
*H03F 1/56* (2006.01)
*H03F 3/21* (2006.01)
*H03F 1/30* (2006.01)
*H03H 1/00* (2006.01)
*H01L 23/31* (2006.01)
*H01L 23/495* (2006.01)
*H01L 23/66* (2006.01)
*H03F 3/193* (2006.01)
*H05K 7/00* (2006.01)
*H01L 23/64* (2006.01)
*H03H 7/38* (2006.01)

US 9,800,208 B2

RADIO FREQUENCY DEVICES WITH SURFACE-MOUNTABLE CAPACITORS FOR DECOUPLING AND METHODS THEREOF

RELATED APPLICATIONS

This application is continuation of and claims priority to U.S. patent application Ser. No. 14/316,484, filed Jun. 26, 2014, the contents of which are incorporated herein by reference in their entirety.

TECHNICAL FIELD

Embodiments of the subject matter described herein relate generally to electronic devices, and more particularly to radio frequency (RF) semiconductor applications.

BACKGROUND

Radio frequency (RF) devices are used in a wide variety of applications, including increasingly common wireless communication systems. As the use of such RF devices proliferates, the cost of such RF devices increases in importance.

One source of increased costs in RF devices is the use of specialized lumped element devices. For example, the use of specialized capacitors and inductors in some RF devices can be a significant source of cost in the overall device. This is particularly true for lumped element devices, such as relatively large capacitors and inductors.

For these reasons there is a continuing need for techniques to reduce the costs of RF devices, and in particular to reduce the costs of RF devices associated with the use of lumped elements.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein can provide semiconductor devices with high performance at a lower cost. Embodiments include devices that are typically used in radio frequency (RF) applications. Specific examples include amplifiers, including multi-path amplifiers (e.g., amplifiers that include two, three, or more parallel amplification paths), such as Doherty and balanced power amplifiers.

In general, the embodiments described herein can provide improved cost and/or performance in radio frequency (RF) devices by using surface-mountable capacitors to decouple transistors from a power supply. The use of the surface-mountable capacitor can significantly reduce the cost of the overall RF device compared to other designs, such as those that use relatively high cost wire-bondable capacitors. Additionally, the use of the surface-mountable capacitor can facilitate placement of the capacitor close to the RF cold point, and can thereby reduce the parasitic inductance between the capacitor and the RF cold point.

In one embodiment, an RF device is provided that comprises at least one transistor configured to implement the RF device, a package containing the at least one transistor, and a surface-mountable capacitor. The surface-mountable capacitor is coupled in a shunt configuration between the at least one transistor and a power supply. So configured, the surface-mountable capacitor decouples the at least one transistor from the power supply. In a particular embodiment, the power supply includes a DC bias, and the surface-mountable capacitor is coupled between the DC bias and an RF cold point on the RF device.

Figure 1:
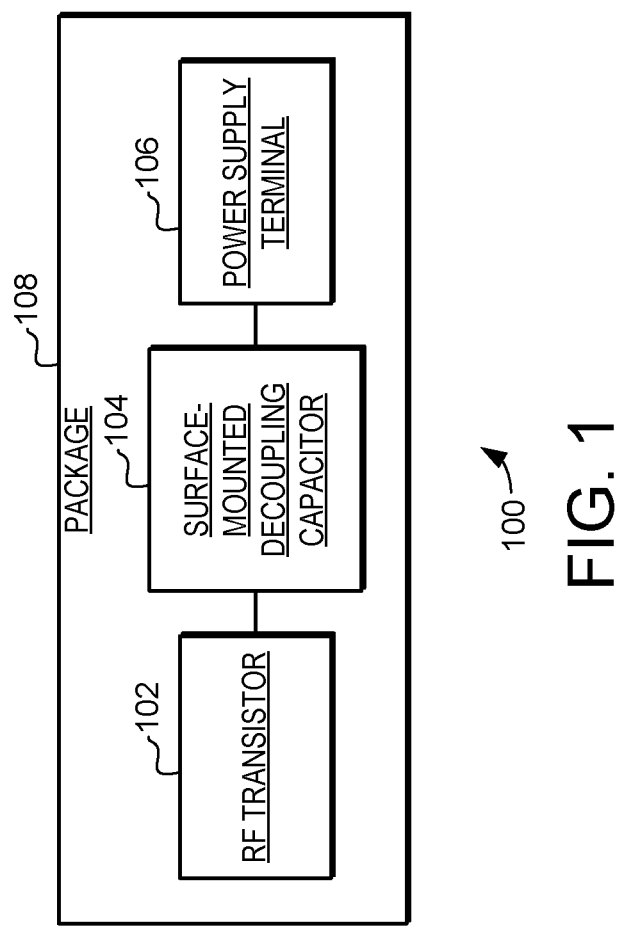
FIG. 1 is a block diagram of an RF device in accordance with an example embodiment.

FIG. 1 illustrates a block diagram of an RF device 100. The RF device 100 includes an RF transistor 102, a surface-mounted decoupling capacitor 104, a power supply terminal 106, and a package 108. In general, the package 108 serves to contain the RF transistor 102 and associated elements and provides the terminations (e.g., leads) that are used to connect the elements inside the package to external circuitry outside the package 108. The package 108 can include any suitable type of package, such as an air cavity package or over molded package, and including both leaded and leadless packages.

The RF transistor 102 serves to implement the RF device 100 and can include any suitable type of transistor. For example, RF transistor 102 can include a variety of different types of field effect transistors (FETs) commonly used in RF devices. Additionally, in some embodiments, multiple transistors may be used. For example, in multipath RF amplifiers each path may have one or more transistors in each of the multiple paths.

The power supply terminal 106 serves to provide a bias voltage to the RF transistor. In an exemplary implementation, the power supply terminal 106 can be coupled to a DC bias source. In some embodiments, the DC bias is supplied through terminations on the package 108 from an external source. For example, the power supply terminal 106 may provide the DC bias from a source external to the package 108 and through a biasing lead or decoupling lead.

In general, surface-mounted or surface-mountable capacitors are capacitors that are designed to be mounted on a surface with solderable connections. To facilitate this, the solderable connections (e.g., a first node and a second node, which also could be referred to as "terminals") of a surface-mountable capacitor are substantially coplanar, such that the solderable connections can be soldered to the surface. For rectangular geometry capacitors, the solderable connections can be arranged along either the two short or the two long edges. Surface-mountable capacitors can be made with a variety of technologies, including high dielectric constant materials such as barium and strontium titanates, ceramics, silicon integrated passive devices, etc.

In the RF device 100, the surface-mounted capacitor 104 is configured to decouple the RF transistor 102 from the power supply terminal 106. In a typical implementation, the surface-mounted capacitor 104 is connected in a shunt configuration relative to the power supply terminal 106. In one specific example, the surface-mounted capacitor 104 has a first node coupled to an RF cold point, while a second node is coupled to a DC bias such as ground. In such a configuration the surface-mountable capacitor 104 is in a shunt configuration.

In such an embodiment, the RF cold point is defined as point within RF device 100 where no RF signals are present. Typically RF cold points are created with inductors and other elements that are added to prevent RF signals from reaching that node. As an example, RF cold points can be created for suitable power supply decoupling networks to be connected to, with the aim of preventing RF signals from leaking into the power supply decoupling network.

In a typical implementation, the surface-mounted capacitor 104 will include a relatively high value capacitor. Such relatively high value capacitors can be a significant portion of the cost of the RF device 100. Using a surface-mounted capacitor 104 instead of other, more expensive types of capacitors can significantly reduce the overall cost of the RF device 100. For example, a wire-bondable capacitor can have a cost of more than 20 times that of an off-the-shelf surface-mountable capacitor of similar size and performance/properties. This is particularly true for capacitors rated for high break down voltage and/or for high temperature applications. For example, RF amplifiers designed to generate up to 2 watts or greater will often require capacitors with relatively high breakdown voltages and high temperature rating. Again, using a surface-mountable capacitor can greatly reduce the cost of the RF amplifier.

As was noted above, in one embodiment, the surface-mounted capacitor 104 is coupled between a lead of the package 108 and the power-supply 106. For example, the surface-mounted capacitor 104 can be shunt-connected between a biasing lead or a decoupling lead and the power supply 106. In one particular implementation, the surface-mounted capacitor 104 can be mounted directly to either a biasing lead or a decoupling lead.

In general, a biasing lead is a lead used to bring a DC bias from an external source into the RF device 100. For example, biasing leads can be used apply a DC bias to the transistor drain from an external supply. Decoupling leads are used to provide additional decoupling for the device. In some cases, leads can be used for both biasing and decoupling. In each of these cases, a surface-mounted capacitor 104 mounted directly to the biasing lead can thus be used decouple the external supply from the RF device 100.

In such an embodiment, the surface-mounted capacitor 104 can be mounted external to the package 108, and thus directly to the lead outside the package 108. In some other embodiments, the surface-mounted capacitor 104 is mounted inside the package 108. For example, the surface-mounted capacitor 104 can be mounted to a die inside the package 108. In one specific implementation, the surface-mounted capacitor 104 can be mounted to a ground pad or other suitable pad on the die.

In some embodiments, a first node of the surface-mounted capacitor 104 is mounted to a first pad on the die and a second node is mounted to the flange in the package, where the flange serves as a power supply terminal of the device. In some cases, the surface-mounted capacitor 104 can be mounted directly to the flange, while in other cases the surface-mounted capacitor 104 can be mounted to an interposer that is mounted to the flange. Such an interposer can be formed from a variety of structures, such as printed circuit board (PCB) materials. In some implementations, the surface-mounted capacitor 104 can be mounted to multiple interposers, with the multiple interposers used to level the surface-mounted capacitor 104.

In such embodiments, the interposer may be ribbon or wire bonded to provide connection to other structures, such as to a ground or an RF cold point. The interposer may itself include a pad to which the surface-mounted capacitor 104 is mounted. In such embodiments, the surface-mounted capacitor 104 can be mounted to the pad with solder or conductive epoxy.

In yet other implementations, the surface-mounted capacitor 104 is mounted to the flange with a conductive block. For example, the surface-mounted capacitor 104 is mounted to the flange using a solder or other metallic block between the surface-mounted capacitor 104 and the flange.

Figure 2A:
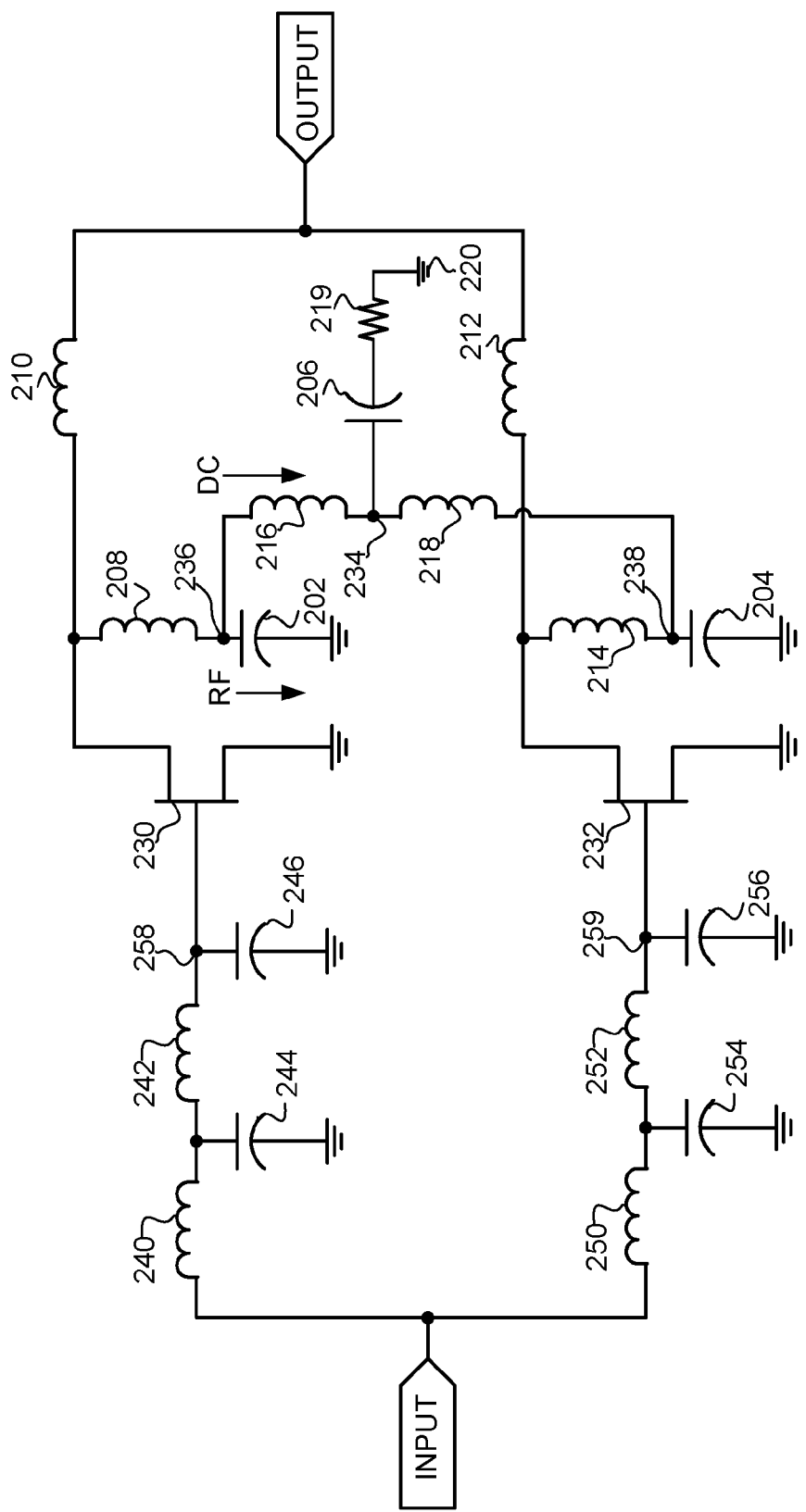
FIGS. 2A and 2B are circuit diagrams for exemplary RF devices in accordance with example embodiments.

Turning now to FIG. 2A, a circuit diagram for an exemplary RF device 200 is illustrated. The RF device 200 is exemplary of the type of devices in which a surface-mountable capacitor may be used for decoupling. In this case, the RF device 200 includes a dual-path RF amplifier with an input and an output.

The RF device 200 includes two transistors 230 and 232, each including a control terminal (e.g., a gate) and two current carrying terminals (e.g., a source and a drain). The control terminals of the transistors 230 and 232 are tied to the respective inputs, and each transistor 230, 232 has one current carrying terminal tied to ground (or to another voltage reference). The other current carrying terminal of each of the transistors 230 and 232 is coupled to the output through inductors 210 and 212. The control terminals of the transistors 230 and 232 are coupled to the inputs through inductors 240, 242, 250, 252, and capacitors 244 and 254, with those inductors and capacitors providing impedance matching at the input. Also included are inductors 208, 210, 212 and 214 which are used for impedance matching at the output. The inductors 216 and 218 represent inherent parasitic inductances. Such parasitic inductances can be created by structures such as wire bonds and package leads.

The RF device 200 also includes DC blocking capacitors 202 and 204. Finally, the RF device 200 includes two control terminal decoupling capacitors 246 and 256, and a current carrying terminal decoupling capacitor 206.

During operation, the RF device 200 will receive RF signals at the input and drive amplified RF signals to the output. The DC blocking capacitors 202 and 204 will block DC signals but allow high frequency RF signals to flow to their respective grounds. This prevents DC bias voltages from shorting to ground. For example, in some embodiments a positive DC bias voltage will be inputted to the RF device 100 at the OUTPUT node. In such a case, the DC blocking capacitors 202 and 204 prevent this positive DC bias from shorting to the corresponding grounds.

Conversely, the inductors 216 and 218 block RF signals such that the node 236 between the inductor 208 and capacitor 202 is an RF cold point. Likewise, the node 238 between inductor 214 and capacitor 204 is an RF cold point. Thus, low frequency signals may pass through inductors 216 and 218 to the node 234, while high frequency RF signals do not. Likewise, the nodes 258 and 259 are RF cold points in embodiments where the control terminals of the transistors 230 and 232 have sufficient capacitance. In this case, the inductors 242 and 252 and capacitors 246 and 256 together with the relatively high control terminal capacitance provide a decoupling network.

In general, decoupling capacitors are used in RF applications to decouple one part of the RF device from other elements. In RF device 200, the decoupling capacitor 206 serves to decouple the transistors 230 and 232 and associated elements from a power supply. The decoupling capacitor 206 allows envelope signals and other relatively low frequency signals present at node 234 to shunt to the ground 220, thus reducing the effects of those signals on the RF device 200. The decoupling capacitor 206 also can provide energy storage that helps maintain the bias level in the presence of voltage.

Likewise, the control terminal decoupling capacitors 256 and 246 serve to decouple the control terminals of the transistors 230 and 232 and associated elements from the control terminal power supply. Again, these decoupling capacitors 256 and 246 allow envelope signals and other relatively low frequency signals present at nodes 258 and 259 to shunt to ground.

The decoupling capacitors 206, 256 and 246 would typically be relatively large capacitors. For example, in the RF device 200 the decoupling capacitor 206 would typically have a capacitance of between about 10 nanofarads and 10 microfarads, although it may have a larger or smaller capacitance value.

Because the decoupling capacitors 206, 256 and 246 can include such a relatively large capacitor, it can represent a significant portion of the cost of the RF device 200. In accordance with the embodiments described herein, some or all of the decoupling capacitors can be implemented with a surface-mountable capacitor. Using a surface-mountable capacitor instead of other, more expensive types of capacitors can significantly reduce the overall cost of the RF device 200. This is particularly true for high power applications that use capacitors with high breakdown voltages.

In the illustrated example, a resistor 219 is added between the decoupling capacitor 206 and the ground 220. In general, the resistor 219 is a damping resistor added in series with the decoupling capacitor 206. According to an embodiment, the damping resistor 219 has a resistance value in a range of about 0.5 ohms to about 10 ohms, although the resistance value may be higher or lower, as well. The damping resistor 219 serves to "dampen" low frequency resonances that may arise from the interaction of the decoupling capacitor 206 and surrounding inductive elements. It should be noted that such a damping resistor 219 may not be included in all embodiments. In a typical embodiment the damping resistor 219 can be formed as an integrated passive device on a die. As will be discussed in greater detail below, such an embodiment can be used where the surface-mountable capacitor 206 has a node mounded to interposer, such as an integrated passive device die.

Figure 2B:
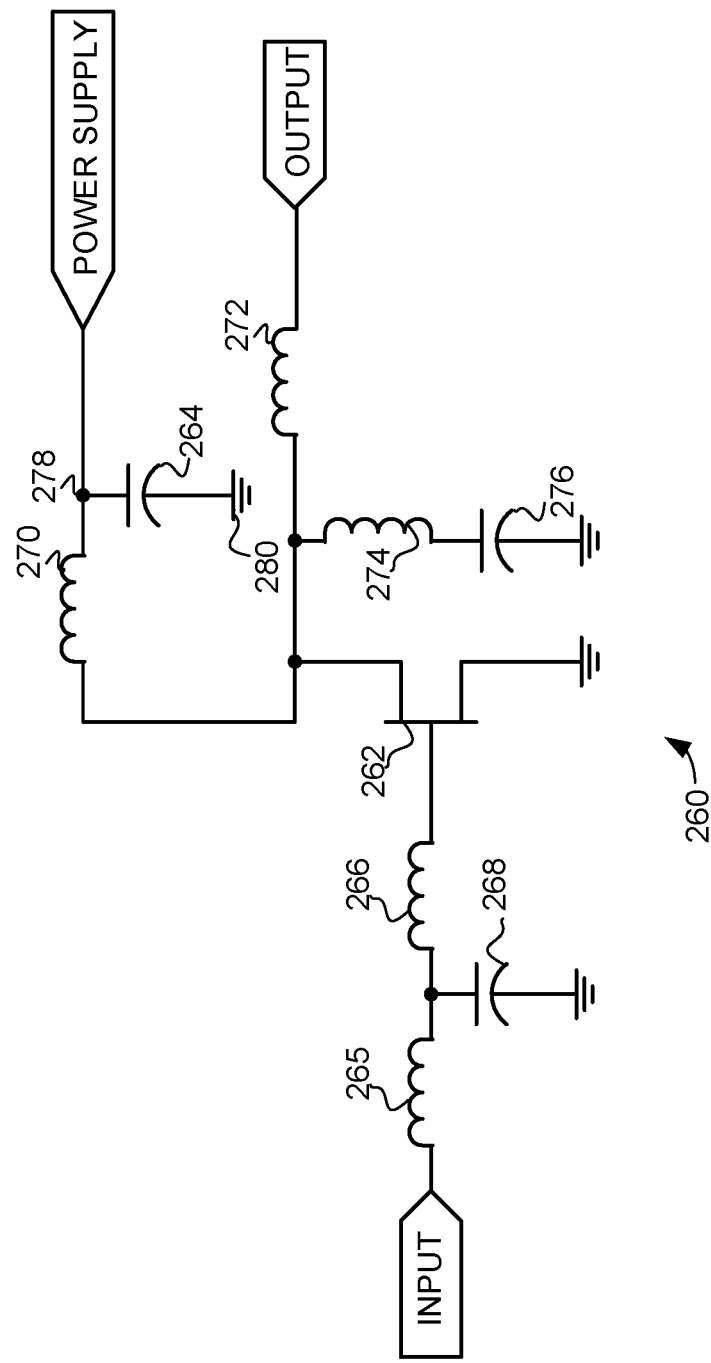

Turning now to FIG. 2B, a circuit diagram for a second exemplary RF device 260 is illustrated. The RF device 260 is exemplary of the type of devices in which a surface-mountable capacitor may be used for decoupling. In this case, the RF device 260 includes a single-path RF amplifier with one input and one output.

The RF device 260 includes a transistor 262, with the control terminal of the transistor 262 tied to the input, and one of the current carrying terminals of the transistor 262 tied to ground. The other current carrying terminal of the transistor 262 is coupled to the output through inductor 272, and to the power supply through inductor 270. The control terminal of transistor 262 is coupled to the input through inductors 265 and 266 and capacitor 268 to provide impedance matching at the input. Inductors 270 and 274 are used for impedance matching at the output. The inductor 272 represents an inherent parasitic inductance. The RF device 200 also includes a DC blocking capacitor 276 and a decoupling capacitor 264.

Like the previous embodiment, the decoupling capacitor 264 is coupled to an RF cold point at node 278. In this embodiment, the RF cold point is an RF choke point. In this case the RF choke point is created by inductor 270, where the inductor 270 serves to choke the RF signals at the current carrying terminal of transistor 262 to which the inductor 270 is coupled, and prevent the RF signals from reaching node 278.

Again, the decoupling capacitor 264 is used to decouple the transistor 262 from a power supply. The decoupling capacitor 264 allows noise, envelope signals and other relatively low frequency AC signals present at node 278 to shunt to the ground 280. In accordance with the embodiments described herein, the decoupling capacitor 264 can be implemented with a surface-mountable capacitor. Using a surface-mountable capacitor instead of other, more expensive types of capacitors can significantly reduce the overall cost of the RF device 260.

Figure 3B:
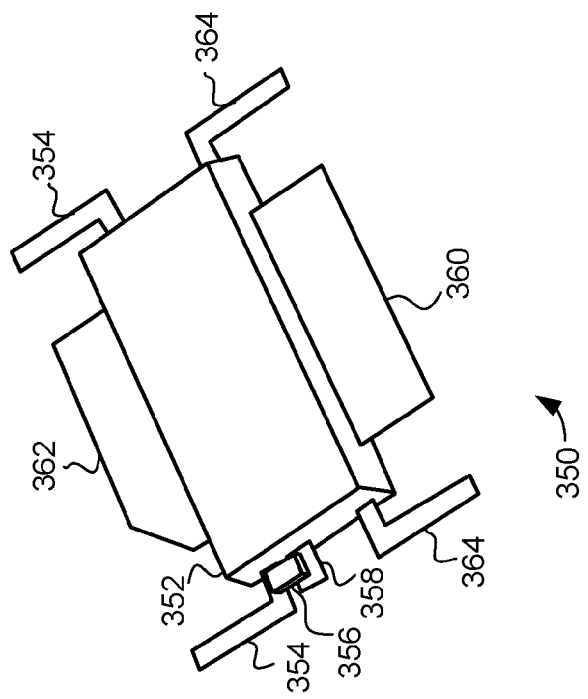
FIGS. 3A and 3B are perspective views of RF devices in accordance with example embodiments.
Figure 3A:
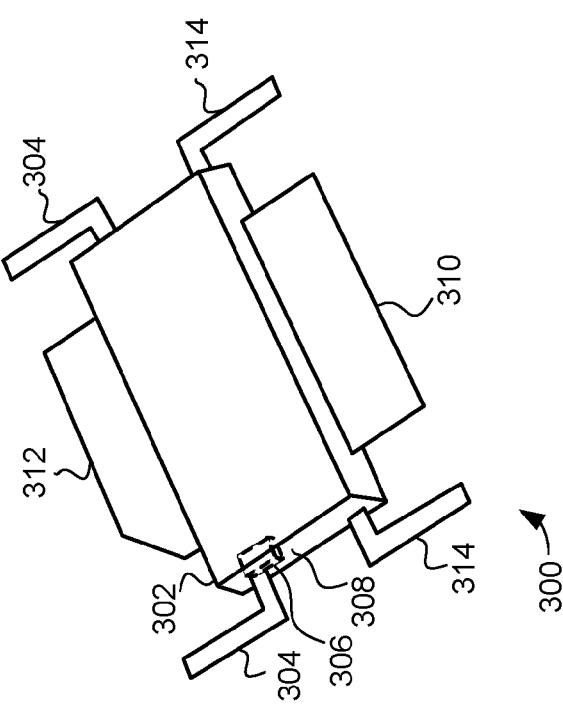

Turning now to FIG. 3A, a perspective view of an RF device 300 is illustrated. In this embodiment the RF device 300 is contained in an overmolded package 302 that includes a plurality of leads 304, 310, 312, 314. The leads include RF input lead 310, RF output lead 312, first bias leads 304 (e.g., output-side bias leads), and second bias leads 314 (e.g., input-side bias leads). In accordance with the embodiments described herein, a surface-mountable capacitor 306 is implemented to decouple the RF device from a power supply. In this embodiment the surface-mountable capacitor 306 is mounted inside the overmolded package 302. A first node of the surface-mountable capacitor 306 is surface mounted directly to the lead 304 as it extends inside the package, and a second node is mounted directly to a conductive flange 308 inside the package 302, where the flange 308 serves as a power supply terminal of the device. When device 300 is incorporated into a system, the flange 308 is coupled to ground (or to another voltage reference that provides the power supply). So configured, the surface-mountable capacitor 306 is coupled in a shunt configuration between a current carrying terminal of at least one transistor and a power supply in the RF device 300 in a way that decouples the transistor from the power supply.

In this particular example, the lead 304 can include a biasing lead or a decoupling lead. With the lead 304 being an RF cold point. The surface-mountable capacitor 306 is coupled between the DC bias and an RF cold point. In such a configuration, the surface-mountable capacitor 306 blocks the DC bias from reaching the RF cold point.

It should be noticed that this is just one example of how a surface-mountable capacitor can be mounted to leads inside the package 302, and that other embodiments are also possible. Although only one decoupling capacitor 306 is shown in FIG. 3A, other decoupling capacitors could be coupled to other biasing or decoupling leads, as well.

Turning now to FIG. 3B, a perspective view of an RF device 350 is illustrated. RF device 350 is similar to RF device 300 illustrated in FIG. 3A but differs in that the decoupling capacitor 356 is mounted outside the package 352 rather than inside the package.

Specifically, in this embodiment, the RF device 300 is contained in an overmolded package 352 that includes a plurality of leads 354, 360, 362, 364. The leads include RF input lead 360, RF output lead 362, first bias leads 354 (e.g., output-side bias leads), and second bias leads 364 (e.g., input-side bias leads). In this embodiment, the surface-mountable capacitor 356 is mounted external to the overmolded package 352. A first node of the surface-mountable capacitor 356 is surface mounted directly to the lead 354 outside the package 352, and a second node is mounted directly to a portion of a ground contact extension 358 that extends outside the package. Although not evident from FIG. 3B, the ground contact extension 358 is electrically coupled to the conductive flange within the device 350, where the flange serves as a power supply terminal of the device. When device 350 is incorporated into a system, the flange (and thus the ground contact extension 358) is coupled to ground (or to another voltage reference that provides the power supply). So configured, the surface-mountable capacitor 356 is coupled in a shunt configuration between a current carrying terminal of at least one transistor and a power supply in the RF device 350 in a way that decouples the transistor from the power supply.

In this particular example, the lead 354 can include a biasing lead or a decoupling lead. With the lead 354 being an RF cold point, the surface-mountable capacitor 356 is coupled between the DC bias and an RF cold point. In such a configuration, the surface-mountable capacitor 356 blocks the DC bias from reaching the RF cold point. Although only one decoupling capacitor 356 is shown in FIG. 3B, other decoupling capacitors could be coupled between other biasing or decoupling leads and ground contact extensions, as well.

Figure 4:
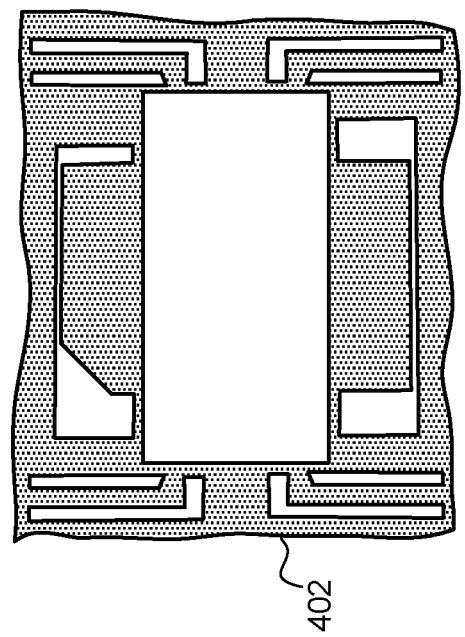
FIG. 4 is a top view of a lead frame in accordance with an example embodiment.

The embodiment illustrated in FIG. 3B can be manufactured by trimming the ground contact extension 358 in a way that a portion of the ground contact extension 358 extends outside the package after over molding. Specifically, the RF device 350 would typically be packaged by mounting one or more die on a flange. A lead frame, which includes multiple leads 354, 360, 362, 364, conductive material that is later trimmed to form the ground contact extension(s) 358, and various sacrificial connecting features, is then positioned around the flange. In an alternate embodiment, the flange may form a portion of the lead frame. Turning briefly to FIG. 4, an exemplary lead frame 402 is illustrated. As can be seen in FIG. 4 the untrimmed lead frame 402 is a single piece of metal. With the lead frame 402 positioned around a flange (not shown in FIG. 4) the lead frame 402 can be wire bonded to pads on the die at appropriate locations.

Referring to FIGS. 3B and 4 together, the RF device is then over molded to contain the die and flange, while the leads and ground contact extension of the lead frame 402 extend outside the over molding. Finally, the lead frame 402 is trimmed to separate the individual leads 354, 360, 362, 364. Due to this trimming, a portion of a ground contact extension 358 also is left extending outside the package 352. The surface-mountable capacitor can then be mounted directly to the lead 354 and the portion of the ground contact extension 358. This mounting can be performed with conductive epoxies, solder or other suitable techniques.

It should be noticed that this is just one example of how a surface-mountable capacitor can be mounted to leads outside the package, and that other embodiments are also possible. For example, a surface-mountable capacitor can instead be mounted below the leads. Also, the lead itself could be in a different position relative to the package.

The embodiments illustrated in FIGS. 3A, 3B and 4 can provide several potential advantages. As was discussed above the use of a surface-mountable capacitor 306 and 356 can greatly reduce the cost of the RF device 300 and 350. Furthermore, this position of the surface-mountable capacitor 306 and 356 places the capacitor relatively close to the RF device, and thus can reduce parasitic inductance between the capacitor and the power supply, transistor or other active elements.

In the embodiment of FIG. 3A, the position of the surface-mountable capacitor 306 relatively close to other elements may reduce the parasitic capacitance, when compared with the embodiment of FIG. 3B. In the embodiment of FIG. 3B, the position of the surface-mountable capacitor 356 outside the package 352 provides for more room for other devices inside the package 302, when compared with the embodiment of FIG. 3A. In either embodiment, the surface-mountable capacitor 306 or 356 will be relatively close to the package plane.

Figure 5:
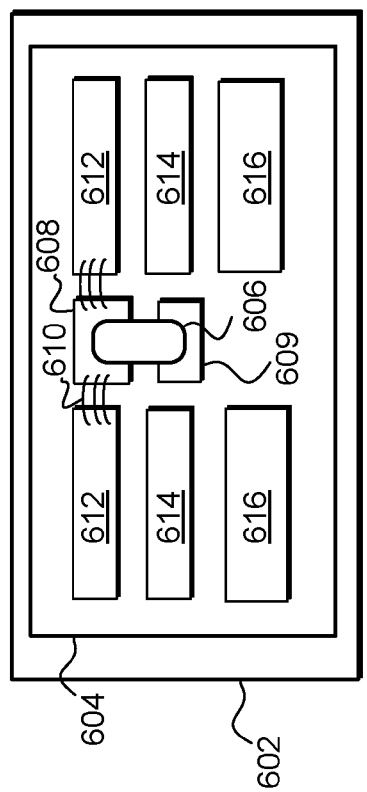
FIGS. 5, 6, 7 and 8 are top views of RF devices in accordance with example embodiments.

Turning now to FIG. 5, a schematic top view of an RF device 500 is illustrated. In this embodiment, the RF device 500 is contained in a package 502, of which a portion is illustrated. Inside the package 502 is a conductive flange 504 on which multiple components 512, 514 and 516 are mounted, where the flange 504 serves as a power supply terminal of the device. These components 512, 514, and 516 can include a variety of devices, including transistor dies, capacitors, and circuit boards on which RF components are formed. The components 512, 514 and 516 may also include a variety of connection pads, such as the pads used for wire bonding. Although not shown, wirebonds may interconnect the components 512, 514, 516. In one particular embodiment, the components 514 can include integrated circuit dies that contain transistors for implementing the RF device 500, while components 512 include integrated passive devices on dies for implementing portions of the output side circuitry of the RF device 500, and while components 516 include integrated passive devices on dies for implementing portions of the input side circuitry of the RF device 500.

In accordance with the embodiments described herein, a surface-mountable capacitor 506 is implemented for decoupling. In this embodiment the surface-mountable capacitor 506 is mounted an interposer 508 which is mounted to flange 504 and connected with wire bonds 510 to other components 512 in the RF device 500. For decoupling the surface-mountable capacitor 506 would be connected in a shunt configuration relative to a power supply connected to the RF device 500 (e.g., connected to the flange 504), such as a DC bias ground. In one specific example, the surface-mounted capacitor 506 has a first node coupled to an RF cold point, while a second node is coupled to ground. In this illustrated embodiment, the surface-mountable capacitor 506 is connected to the RF cold point through the wire bonds 510, and the connection to the DC bias is through the interposer 508 and the flange 504. In such a configuration the surface-mountable capacitor 506 is in a shunt configuration and blocks the DC bias from reaching an RF cold point.

The interposer 508 can be formed from a variety of structures, such as PCB materials. The interposer 508 would typically be formed to include contact pads for connecting the wire bonds 510 and for mounting the surface-mountable capacitor 506. These pads can include pads that are coupled to the RF cold point and ground pads that are coupled to ground. The ground pads could be coupled to ground or the flange with vias in the interposer 508. Additionally, the interposer 508 could have solder masks that keeps the wire bond pad free from any solder encroachment. The interposer 508 can be mounted to the flange 504 using conductive epoxy or other suitable techniques. Likewise, the surface-mountable capacitor 506 can be mounted to the interposer using any suitable surface mounting technique.

As other examples the interposer 508 can include a die, including an integrated circuit, an integrated passive device die, silicon die, or other suitable dies. Using a die as interposer 508 may offer several advantages. For example, the use of a die as the interposer 508 can facilitate the adding of a damping resistor (e.g., resistor 219 of FIG. 2A) in series with the decoupling capacitor 506. In such an embodiment the interposer 508 could include an integrated passive device die upon or within which the damping resistor is formed.

The embodiment illustrated in FIG. 5 can again provide several potential advantages. As was discussed above the use of a surface-mountable capacitor 506 can greatly reduce the cost of the RF device 500. Furthermore, the surface-mountable capacitor 506 can provide a relatively high capacitance value. Finally, positioning the surface-mountable capacitor 506 and interposer 508 between the components 512 places the capacitor 506 in a relatively close position relative to other elements of the RF device 500. Again, such close proximity can reduce parasitic inductance between the capacitor 506 and a transistor on RF device 500.

Figure 6:
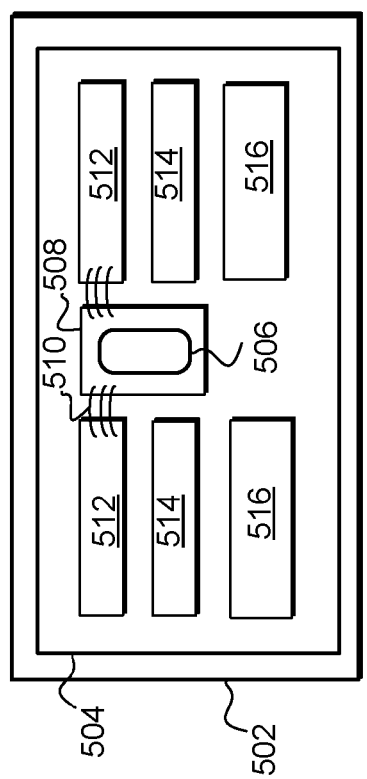

Turning now to FIG. 6, a schematic top view of an RF device 600 is illustrated. RF device 600 is similar to RF device 500 with the difference that two interposers are used to mount the surface-mountable capacitor 606.

In this embodiment, the RF device 600 is contained in a package 602. Inside the package 602 is a flange 604 on which multiple components 612, 614 and 616 are mounted, where the flange 604 serves as a power supply terminal of the device. The components 614 can include integrated circuit dies that contain transistors for implementing the RF device 600, while components 612 include integrated passive devices on dies for implementing portions of the output side circuitry of the RF device 600, and while components 616 include integrated passive devices on dies for implementing portions of the input side circuitry of the RF device 600. Although not shown, wirebonds may interconnect the components 612, 614, 616.

In accordance with the embodiments described herein, a surface-mountable capacitor 606 is implemented for decoupling. In this embodiment, the surface-mountable capacitor 606 is mounted on the two interposers 608 and 609. The interposer 608 is mounted to flange 604 and connected with wire bonds 610 to the components 612. The interposer 609 is likewise mounted to the flange 604. For decoupling, the surface-mountable capacitor 606 would be connected in a shunt configuration. In one specific example, the surface-mounted capacitor 606 has a first node coupled to an RF cold point through the first interposer 608 and the wire bonds 610, while a second node is coupled to ground through the second interposer 609 (e.g., through vias extending through the second interposer 609).

Figure 7:
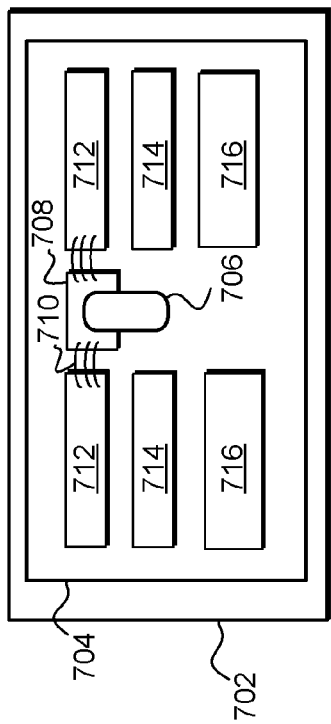

Turning now to FIG. 7, a schematic top view of an RF device 700 is illustrated. RF device 700 is similar to RF device 500 with the difference that the surface-mountable capacitor 706 has one terminal mounted to an interposer 708 and a second terminal mounted to the flange 704, where the flange 704 serves as a power supply terminal of the device.

In this embodiment, the RF device 700 is contained in a package 702. Inside the package 702 is a flange 704 on which multiple components 712, 714 and 716 are mounted. Although not shown, wirebonds may interconnect the components 712, 714, 716. In accordance with the embodiments described herein, a surface-mountable capacitor 706 is implemented for decoupling.

In this embodiment, the surface-mountable capacitor 706 is mounted on both an interposer 708 and the flange 704. The interposer 708 is mounted to the flange 704 and connected with wire bonds 710 to other components 712. For decoupling the surface-mountable capacitor 706 would be connected in a shunt configuration with a first node coupled to an RF cold point through the interposer 708 and the wire bonds 710, while a second node is coupled to ground through the flange 704.

In some embodiments, the second node of the surface-mountable capacitor 706 may be mounted directly to the flange 704. In other embodiments the surface-mountable capacitor 706 may be mounted to the flange 704 through a conductive block. Such a conductive block can provide the electrical and mechanical connection to the flange 704 while also leveling the surface-mountable capacitor 706. Such a conductive block can be formed of solder, metal, or other conductive elements such as PCB.

Figure 8:
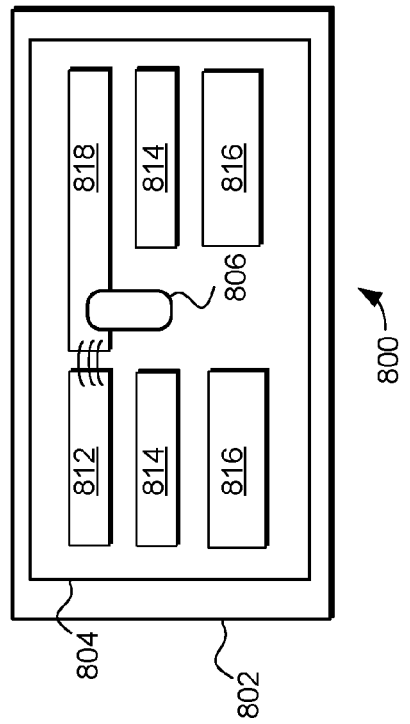

Turning now to FIG. 8, a schematic top view of an RF device 800 is illustrated. RF device 800 is similar to RF device 700 with the difference that the surface-mountable capacitor 806 is mounted to directly to a die 818 at one terminal to the flange 804 at the other terminal.

In this embodiment, the RF device 800 is contained in a package 802. Inside the package 802 is a flange 804 on which multiple components 812, 814, 816 are mounted, where the flange 804 serves as a power supply terminal of the device. The components 814 can include integrated circuit dies that contain transistors for implementing the RF device 800, while components 812 include integrated passive devices on dies for implementing portions of the output side circuitry of the RF device 800, and while components 816 include integrated passive devices on dies for implementing portions of the input side circuitry of the RF device 800. Although not shown, wirebonds may interconnect the components 812, 814, 816. Also mounted on the flange 804 is a die 818. The die 818 can also implement portions of the output side circuitry of the device 800 (e.g., similar to component 812, but with a different physical configuration. The die 818 can include an integrated circuit die, an integrated passive die, silicon die, or other suitable die. In accordance with the embodiments described herein, a surface-mountable capacitor 806 is implemented for decoupling.

In this embodiment, the surface-mountable capacitor 806 is mounted on both the die 818 and the flange 804. For decoupling, the surface-mountable capacitor 806 would be connected in a shunt configuration with a first node coupled to an RF cold point through the die 818, while a second node is coupled to ground through the flange 804. The RF cold point of die 818 could be coupled to an RF cold point of die 818 using wirebonds, as shown. Thus, the first node is coupled directly the RF cold point, without wire bonds between the RF cold point and the first node. This can further reduce the parasitic inductance between the surface-mountable capacitor 806 and the RF cold point.

Again, in some embodiments the second node of the surface-mountable capacitor 806 may be mounted directly to the flange 804. In other embodiments, the surface-mountable capacitor 806 may be mounted to the flange 804 through a conductive block. In another embodiment the second node can be bonded to a ground pad adjacent to the RF cold point. In such an embodiment the ground pad can be coupled to ground through a via.

The embodiments described herein thus can provide improved cost and/or performance in RF devices by using surface-mountable capacitors to decouple transistors from a power supply (e.g., by using surface-mountable capacitors to block DC bias from reaching an RF cold point on the RF device). The use of the surface-mountable capacitor can significantly reduce the cost of the overall RF device compared to other designs, such as those that use relatively high cost wire-bondable capacitors. Additionally, the use of the surface-mountable capacitor can facilitate placement of the capacitor close to the RF cold point, and can thereby reduce the parasitic inductance between the capacitor and the RF cold point.

In a first embodiment, an RF device is provided. In this embodiment, the RF device includes: at least one transistor; a package containing the at least one transistor, the package including at least one termination; and a surface-mountable capacitor, the surface-mountable capacitor coupled in a shunt configuration between the at least one transistor and a power supply terminal of the device to decouple the at least one transistor from a power supply.

In a second embodiment, an RF power amplifier is provided. The RF power amplifier includes: a transistor; a package containing the transistor, the package including at least one termination; and a surface-mountable capacitor having a first node and a second node, the surface-mountable capacitor mounted inside the package and coupled between the transistor and a power supply terminal in a shunt configuration, with the first node coupled to an RF cold point between the transistor and the surface-mountable capacitor, and the second node coupled to the power supply terminal, which may be coupled with a direct-current (DC) bias network, the surface-mountable capacitor configured to decouple the DC bias network from the RF cold point.

In a third embodiment, an RF power amplifier is provided. The RF power amplifier includes a transistor; an RF cold point; a package containing the transistor and the RF cold point, the package including a lead; and a surface-mountable capacitor having a first node and a second node, the surface-mountable capacitor coupled between the RF cold point and the lead in a shunt configuration, the surface-mountable capacitor configured to decouple a direct-current (DC) bias network coupled to the lead from the RF cold point The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

As used herein, a "node" means any internal or external reference point, connection point, terminal, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio-frequency (RF) device comprising:
   at least one transistor;
   a package containing the at least one transistor, the package including at least one biasing lead, the biasing lead extending from outside the package to inside the package; and
   a surface-mountable capacitor, the surface-mountable capacitor coupled in a shunt configuration between the at least one transistor and a power supply terminal of the device to decouple the at least one transistor from a power supply, wherein the surface-mountable capacitor is coupled between the biasing lead and the power supply terminal, wherein the surface-mountable capacitor is external to the package and mounted directly to the biasing lead outside the package.

2. The RF device of claim 1 wherein the package comprises at least one of an air cavity package and an over molded package.

3. The RF device of claim 1 wherein the surface-mountable capacitor comprises a first node and a second node, and wherein both the first node and the second node have solderable terminations.

4. The RF device of claim 1 further comprising a damping resistor in series with the surface-mountable capacitor.

5. A radio-frequency (RF) device comprising:
   at least one transistor;
   a package containing the at least one transistor, the package including at least one termination; and
   a surface-mountable capacitor, the surface-mountable capacitor coupled in a shunt configuration between the at least one transistor and a power supply terminal of the device to decouple the at least one transistor from a power supply, wherein a first node of the surface-mountable capacitor is coupled directly to an RF cold point inside the package, wherein a second node of the surface-mountable capacitor is coupled to a flange in the package.

6. The RF device of claim 5 wherein the second node of the surface-mountable capacitor is coupled to the flange with a conductive block.

7. The RF device of claim 5 wherein the first node of the surface-mountable capacitor is coupled to a first pad on a die inside the package, the first pad comprising the RF cold point.

8. The RF device of claim 5 wherein the package comprises at least one of an air cavity package and an over molded package.

9. The RF device of claim 5 wherein the surface-mountable capacitor comprises the first node and a second node, and wherein both the first node and the second node have solderable terminations.

10. The RF device of claim 5 further comprising a damping resistor in series with the surface-mountable capacitor.

11. A radio-frequency (RF) power amplifier comprising:
a transistor;
a package containing the transistor, the package including at least one termination; and
a surface-mountable capacitor having a first node and a second node, the surface-mountable capacitor mounted inside the package and coupled between the transistor and a power supply terminal in a shunt configuration, with the first node coupled to a first pad on a die inside the package corresponding to an RF cold point between the transistor and the surface-mountable capacitor, and the second node coupled to the power supply terminal, which may be coupled with a direct-current (DC) bias network, the surface-mountable capacitor configured to decouple the DC bias network from the RF cold point.

12. The RF device of claim 11 wherein the package comprises at least one of an air cavity package and an over molded package.

13. The RF device of claim 11 wherein both the first node and the second node have solderable terminations.

14. The RF device of claim 11 further comprising a damping resistor in series with the surface-mountable capacitor.

15. A radio-frequency (RF) power amplifier comprising:
a transistor;
an RF cold point;
a package containing the transistor and the RF cold point, the package including a lead, the lead extending from outside the package to inside the package; and
a surface-mountable capacitor having a first node and a second node, the first node of the surface-mountable capacitor mounted directly to the lead inside the package, the surface-mountable capacitor coupled between the RF cold point and the lead in a shunt configuration, the surface-mountable capacitor configured to decouple a direct-current (DC) bias network coupled to the lead from the RF cold point.

16. The RF device of claim 15 wherein the package comprises at least one of an air cavity package and an over molded package.

17. The RF device of claim 15 wherein both the first node and the second node have solderable terminations.

18. The RF device of claim 15 further comprising a damping resistor in series with the surface-mountable capacitor.

* * * * *